United States Patent [19]
Yoshino et al.

[11] Patent Number: 5,523,962
[45] Date of Patent: Jun. 4, 1996

[54] INFINITE IMPULSE RESPONSE DIGITAL FILTER WITH PLURAL PROCESSING UNITS

[75] Inventors: Toshiaki Yoshino, Fremont, Calif.; Hiroyuki Nishimura, Kamakura, Japan

[73] Assignee: Texas Instruments Incorporated, Dallas, Tex.

[21] Appl. No.: 28,673

[22] Filed: Mar. 9, 1993

[30] Foreign Application Priority Data

Mar. 18, 1992 [JP] Japan .................................. 4-093436

[51] Int. Cl.⁶ .................................................. G06F 17/10
[52] U.S. Cl. ............................... 364/724.16; 364/724.01; 364/724.17
[58] Field of Search .................. 364/724.01, 724.13, 364/724.16, 724.17, 724.12

[56] References Cited

U.S. PATENT DOCUMENTS

| | | | |
|---|---|---|---|
| 4,649,507 | 3/1987 | Inaba et al. | 364/724.16 |
| 4,811,263 | 3/1989 | Hedley et al. | 364/724.13 |
| 5,031,132 | 7/1991 | Dolazza | 364/724.17 |

*Primary Examiner*—Paul P. Gordon
*Assistant Examiner*—Emmanuel L. Moise
*Attorney, Agent, or Firm*—William E. Hiller; Richard L. Donaldson

[57] ABSTRACT

A digital filter, in which the operation time can be kept short even when the order of the filter is high. The digital filter comprises a first transversal filter $TF_1$ which has an input terminal connected to a signal input terminal 10, first delay means $DR_1$ which has an input terminal connected to the output terminal of first transversal filter $TF_1$, a second transversal filter $TF_2$ connected to the output terminal of the first delay means $DR_1$, second delay means $DR_2$ which has an input terminal connected to the output terminal of the second transversal filter $TF_2$, adder AD which has one of the input terminals connected to the output terminal of the second delay means $DR_2$, third delay means $DR_3$ which has an input terminal connected to the output terminal of the adder AD and an output terminal connected to the signal output terminal, and a third transversal filter $TF_3$ which has an input terminal connected to the output terminal of the aforementioned third delay means $DR_3$ and an output terminal connected to the other input terminal of the aforementioned adder. In this digital filter, the chain configuration of the operator that determines the time needed for one cycle of operation is a multiplier-adder chain including one multiplier and one adder in each transversal filter. Consequently, its operation time is equal to the sum of the operation times needed by one multiplier and one adder and is unrelated to the order of each transversal filter, that is, the order of the digital filter.

17 Claims, 8 Drawing Sheets

INFINITE IMPULSE RESPONSE DIGITAL FILTER WITH PLURAL PROCESSING UNITS

FIELD OF INVENTION

This invention concerns a type of digital filter. More specifically, this invention concerns a high-speed digital filter which is appropriate for use in a system where high-speed processing is required, such as a video signal processing circuit.

BACKGROUND OF THE INVENTION

There are two types of digital filters: IIR (infinite impulse response) filters with an infinite length of impulse response and FIR (finite impulse response) filters with a finite length response. Usually, all of the analog filters may be converted to IIR filters. Compared with FIR filters, IIR filters display a steep cut-off characteristic curve.

Figure 15:
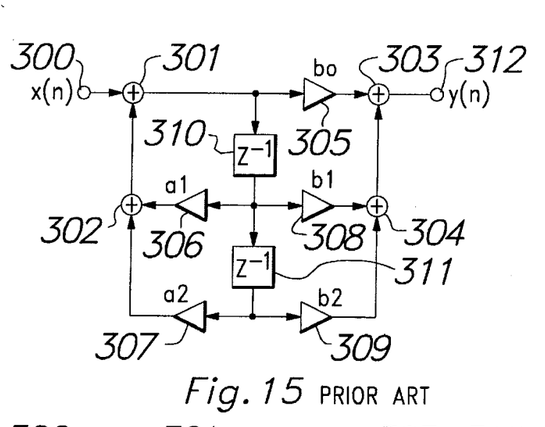
FIG. 15 is a diagram illustrating the architecture of a digital filter of the direct-type second order infinite impulse response.

FIG. 15 shows the direct-type configuration of a second order IIR filter. This IIR filter comprising of four adders 301, 302, 303, 304, five multipliers 305, 306, 307, 308, 309, and two delay registers 310, 311. One of the input terminals of adder 301 is connected to signal input terminal 300, the other input terminal is connected to the output terminal of adder 302. The output terminal of adder 301 is connected to the input terminal of multiplier 305 and the input terminal of delay means 310. The output terminal of multiplier 305 is connected to one of the input terminals of adder 303. The output terminal of adder 304 is connected to the other input terminal of adder 303, and the output terminal of adder 303 is connected to signal output terminal 312. The output terminal of delay register 310 is connected to the input terminal of multiplier 306, the input terminal of multiplier 308, and the input terminal of delay register 311. The output terminal of delay register 311 is connected to the input terminal of multiplier 307 and the input terminal of multiplier 309. One of the input terminals of adder 302 is connected to the output terminal of multiplier 306. The other input terminal is connected to the output terminal of multiplier 307. One of the input terminals of adder 304 is connected to the output terminal of multiplier 308. The other input terminal is connected to the output terminal of multiplier 309.

Adder 301 adds input signal x(n) and the output of adder 302 and outputs the result. Multiplier 305 multiplies the output of adder 301 by coefficient $b_0$ and outputs the result. Adder 303 adds the output of multiplier 305 and the output of adder 304 and outputs the output signal y(n). Delay register 310 gives a prescribed delay time to the output of adder 301 and then outputs the result signal; delay register 311 gives a delay time to the output of delay register 310 and outputs the result signal. Multiplier 306 and multiplier 308 multiply the output of delay register 311 by coefficients $a_1$ and $b_1$, respectively, and output the result signals, respectively. Multiplier 307 and multiplier 309 multiply the output of delay register 311 by coefficients $a_2$ and $b_2$, respectively, and output the result signals. Adder 302 adds the output of multiplier 306 and the output of multiplier 307, and outputs the result signal. Adder 304 adds the output of multiplier 308 and multiplier 309, and outputs the result signal.

The frequency characteristics of the IIR filter depend on the coefficients of the various multipliers, $a_1$, $a_2$, $b_0$, $b_1$, and $b_2$. Signal x(n) input into adder 301 is processed by filtering corresponding to the aforementioned frequency characteristics, and output signal y(n) is output from adder 303.

In this type of IIR filter, in order to further steepen the frequency characteristics, it is necessary to increase the order of the filter used. For example, if the order of the second order IIR filter shown in FIG. 15 is increased to a third IIR filter, the configuration becomes that shown in FIG. 16. If the order is further increased, the Nth IIR filter has a configuration shown in FIG. 17.

Figure 16:
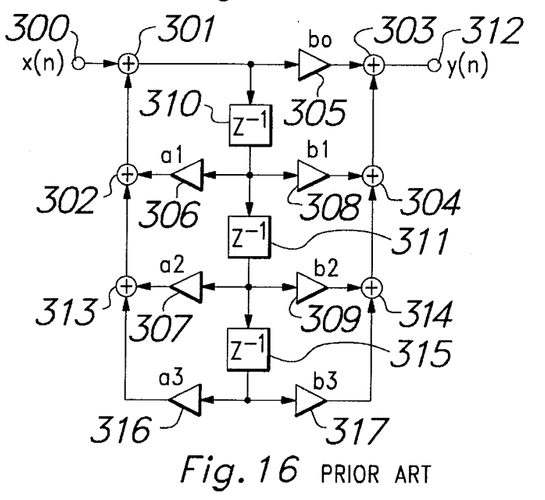
FIG. 16 is a diagram illustrating the architecture of a digital filter of the direct-type third order infinite impulse response.

For the third IIR filter shown in FIG. 16, the configuration is formed by adding two adders 313, 314, one delay register 315 and two multipliers 316, 317 in ladder form to the second order filter shown in FIG. 15. That is, adder 313 is inserted between multiplier 307 and adder 302, adder 314 is inserted between multiplier 309 and adder 304, delay register 315 is connected to the connection point between delay register 311 and multipliers 307, 309, multiplier 316 is connected between delay register 315 and adder 313, and multiplier 317 is connected between delay register 315 and adder 314.

Figure 17:
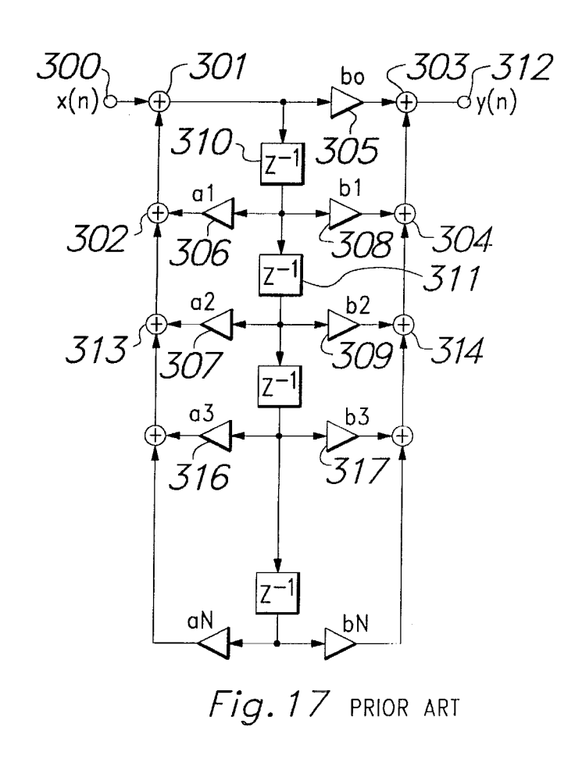
FIG. 17 is a diagram illustrating the architecture of a digital filter of the direct-type Nth order infinite impulse response.

Similarly, the Nth IIR filter shown in FIG. 17 is formed by adding 2N-4 adders, N-2 delay registers, and 2N-4 multipliers to the second order IIR filter shown in FIG. 15. In this way, for the direct-type IIR filter, each time when the order of the filter is increased by one, one delay register, two multipliers, and two adders are added in ladder form.

In the aforementioned direct-type IIR filter, when the adders are connected in series to form a ladder-like configuration, since the order of the filter is increased, the number of the adders connected in series is increased, and the operating time of additions performed in one cycle is increased. For example, for the 10th IIR filter, since 10 adders are connected in series, the operation time has to be 10 times the operation time of a single adder in one cycle. On the other hand, for the filters used in the field of image processing operations, there is a demand for high-speed operation in performing the filtering treatment of the image signal. For example, for the present TV system, operation has to be performed for each output in a time period as short as 66 ns (for one pixel cycle). Consequently, for the direct-type high-order IIR filter, it is actually impossible to obtain an IIR filter with a high order and with the ability of performing an operation for each cycle in such a short time.

SUMMARY OF THE INVENTION

The purpose of this invention is to solve the aforementioned problems of the conventional methods by providing a type of digital filter characterized by the fact that the operation processing time can be suppressed to within a prescribed time even when the order of the filter is significantly increased.

In order to realize the aforementioned purpose, this invention provides a type of digital filter characterized by the fact that it comprises the following parts: a first transversal filter which has an input terminal connected to the signal input terminal and which is virtually of the transposition form; a first delay means which has an input terminal connected to the output terminal of the aforementioned first transversal filter; a second transversal filter which is connected to the output terminal of the aforementioned first delay means and which is virtually of the transposition form; a second delay means which has an input terminal connected to the output terminal of the aforementioned second transversal filter; an adder means which has one input terminal connected to the output terminal of the aforementioned second delay means; a third delay means which has an input terminal connected to the output terminal of the aforementioned adder means and an output terminal connected to the signal output terminal; and a third transversal filter which has an input terminal connected to the output terminal of the aforementioned third delay means and an output terminal connected to the other input terminal of the aforementioned adder means, and which is virtually of the transposition form.

According to this invention, the filtering treatment of the digital filter is carried out by means of three blocks with the aid of the first and second delay means, that is, a first processing unit comprising the first transversal filter, the second processing unit comprising the second transversal filter, and the third processing unit comprising the third transversal filter as well as the first adder and the third delay means. Since the first, second and third transversal filters are of the transposition form, they are irrelevant to the order of the filter. In this case, the necessary operation time is not longer than the sum of the operation times of one multiplier and one adder connected in series in the transversal filter. The third processing unit comprises the first adder, third delay means and third transversal filter. As the configuration consisting of adders and multipliers connected in chain form for two or more sections applies only to the third transversal filter, the operation time does not exceed the sum of the operation times of one multiplier and one adder connected in series within the third transversal filter. Consequently, for the digital filter of this invention, the operation can be performed at a high speed with a short time needed for the operation of processing irrelevant to the order of the filter.

In addition, as there is no change in the filter characteristics even when the first, second, and third processing units are replaced respectively, it is thus possible to replace these three processing units, respectively.

References as applied in the drawings:
$TF_1$, first transversal filter
$TF_2$, second transversal filter
$TF_3$ third transversal filter
$DR_1$, first delay register
$DR_2$, second delay register

DESCRIPTION OF PREFERRED EMBODIMENTS

In the following, this invention will be explained in more detail with reference to embodiments illustrated by FIGS. 1–14.

Figure 1:
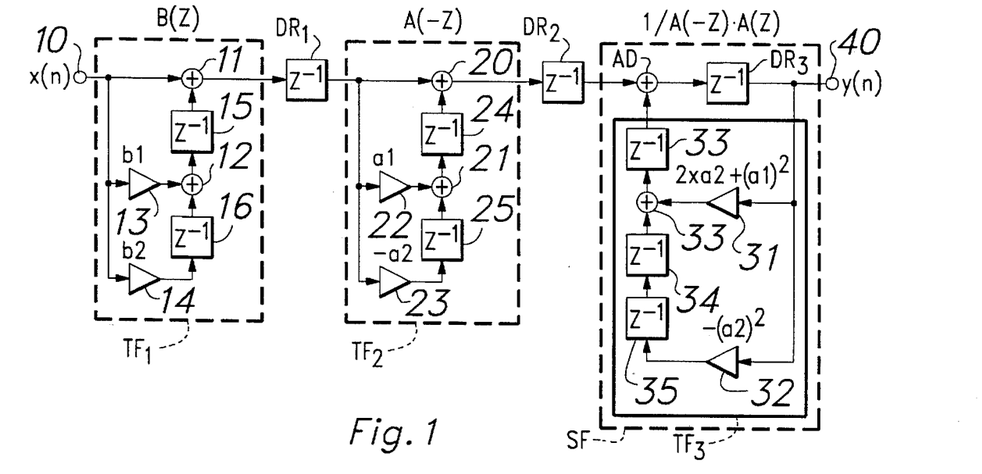
FIG. 1 is a diagram illustrating the architecture of a first embodiment of the digital filter of this invention.

FIG. 1 shows the architecture of a first embodiment of the digital filter in this invention. This type of digital filter is an IIR filter comprising three transversal filters $TF_1$, $TF_2$, $TF_3$ virtually of the transposition form, three delay registers $DR_1$, $DR_2$, $DR_3$, and one adder AD.

First transversal filter $TF_1$ comprises two adders 11, 12, two multipliers 13, 14, and two delay registers 15, 16. Signal input terminal 10 of this digital filter is connected to one of the input terminals of adder 11, the input terminal of multiplier 13, and the input terminal of multiplier 14 in first transversal filter $TF_1$. The other input terminal of adder 11 is connected to the output terminal of delay register 15; the output terminal of adder 11 is connected to the input terminal of first delay register $DR_1$ as the output terminal of first transversal filter $TF_1$. The output terminal of multiplier 13 is connected to one of the input terminals of adder 12; the output terminal of multiplier 14 is connected to the input terminal of delay register 16 and the output terminal of delay register 16 is connected to the other input terminal of adder 12. The input terminal of adder 12 is connected to the input terminal of delay register 15.

Second transversal filter $TF_2$ comprises two adders 20, 21, two multipliers 22, 23, and two delay registers 24, 25. The output terminal of first delay register $DR_1$ is connected to one of the input terminals of adder 20, the input terminal of multiplier 22, and the input terminal of multiplier 23 in second transversal filter $TF_2$. The other input terminal of adder 20 is connected to the output terminal of delay register 24; the output terminal of adder 20 is connected to the output terminal of second transversal filter $TF_2$ and the input terminal of second delay register $DR_2$. The output terminal of multiplier 22 is connected to one of the input terminals of adder 21; the output terminal of multiplier 23 is connected to the input terminal of delay register 25; and the output terminal of delay means 25 is connected to the other input terminal of adder 21. The output terminal of adder 21 is connected to the input terminal of delay register 24.

The output terminal of second delay register $DR_2$ is connected to one of the input terminals of adder AD; the other input terminal of adder AD is connected to the output terminal of third transversal filter $TF_3$; and the output terminal of adder AD is connected to the input terminal of third delay register $DR_3$. The output terminal of third delay register $DR_3$ is connected to signal output terminal 40 of this digital filter and the input terminal of third transversal filter TF$_3$.

Third transversal filter TF$_3$ comprises one adder 30, two multipliers 31, 32, and three delay registers 33, 34, 35. The output terminal of third delay register DR$_3$ is connected to the input terminals of multipliers 31, 32 in third transversal filter TF$_3$. The output terminal of multiplier 31 is connected to one of the input terminals of adder 30; the output terminal of multiplier 32 is connected to the input terminal of delay register 35; the output terminal of delay register 35 is connected to the input terminal of delay register 34; and the output terminal of delay register 34 is connected to the other input terminal of adder 30. The output terminal of adder 30 is connected to the input terminal of delay register 33; and the output terminal of delay register 33 is connected as the input terminal of third transversal filter TF$_3$ to the other input terminal of adder AD.

In first transversal filter TF$_1$, multipliers 13, 14 multiply coefficients b$_1$ and b$_2$, respectively, to input terminal value x(n), and output the result signals. Delay register 16 gives a delay time to the output of multiplier 14, and outputs the result signal. Adder 12 adds the output of multiplier 13 and the output of delay register 16, and outputs the result signal. Delay register 15 gives a delay time to the output of adder 12, and outputs the result signal. Adder 11 adds input signal x(n) and the output of delay register 15, and outputs the result signal as the output signal of first transversal filter TF$_1$.

First delay register DR$_1$ gives a prescribed delay time to the output of first transversal filter TF$_1$, and outputs the result signal.

In second transversal filter TF$_2$, multipliers 22, 23 multiply the output of first delay register DR$_1$ by coefficients a$_1$, –a$_2$, respectively; delay register 25 gives a prescribed delay time to the output of multiplier 23 and outputs the result signal; adder 21 adds the output of multiplier 22 and the output of delay register 25, and outputs the result signal; delay register 24 gives a prescribed delay time to the output of adder 21 and outputs the result signal; adder 20 adds the output of first delay register DR$_1$ and the output of delay register 24, and outputs the result signal as the output of second transversal filter TF$_2$.

Second delay register DR$_2$ gives a prescribed delay time to the output of second transversal filter TF$_2$.

Adder AD adds the output of second delay register DR$_2$ and the output of third transversal filter TF$_3$ and outputs the result signal. Third delay register DR$_3$ gives a prescribed delay time to the output of adder AD, and outputs the result signal as the output of the digital filter.

In third transversal filter TF$_3$, multipliers 31, 32 multiply the output of third delay register DR$_3$ by coefficients 2×a$_2$+ (a1)$^2$, –(a$_2$)$^2$, respectively and output the result signals; delay register 35 gives a prescribed delay time to the output of multiplier 32 and outputs the result signal; delay register 34 gives a prescribed delay time to the output of multiplier 32 and outputs the result signal; adder 30 adds the output of multiplier 31 and the output of delay register 34, and outputs the result signal; delay register 33 gives a prescribed delay time to the output of adder 30, and outputs the result signal as the output of third transversal filter TF$_3$.

The frequency characteristics of this IIR filter depend on the coefficients of the various multipliers in various transversal filters TF$_1$–TF$_3$. Input signal x(n) input into first transversal filter TF$_1$ is processed by filtering according to the frequency characteristics, and output signal y(n) is output from third delay register DR$_3$.

Figure 2:
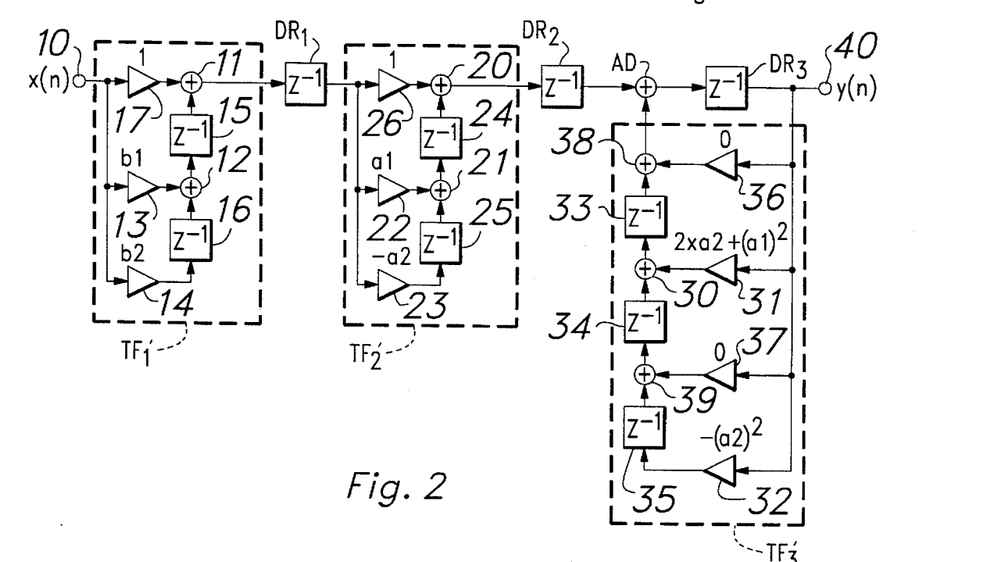
FIG. 2 is a diagram illustrating the architecture obtained as a modification of the digital filter in FIG. 1.

The IIR filter shown in FIG. 1 may be modified to the architecture shown in FIG. 2. For IIR filter shown in FIG. 2, one multiplier 17 is added to first transversal filter TF$_1$ in the IIR filter shown in FIG. 1, one multiplier 26 is added to second transversal filter TF$_2$, and two multipliers 36, 37 and two adders 38, 39 are added to third transversal filter TF$_3$. That is, in first transversal filter TF$_1$', multiplier 17 with a coefficient of 1 is inserted between filter input terminal 10 and one of the input terminals of adder 12. In second transversal filter TF$_2$', multiplier 26 with a coefficient of 1 is inserted between the output terminal of first delay register DR$_1$ and one of the input terminals of adder 20. In third transversal filter TF$_3$', adder 38 is inserted between the output terminal of delay register 33 and the other input terminal of adder AD; multiplier 36 with a coefficient of 0 is connected between the output terminal of third delay register DR$_3$ and one of the input terminals of adder 38; adder 39 is inserted between the output terminal of delay register 34 and the input terminal of delay register 34; and multiplier 32 with a coefficient 0 is connected between the output terminal of third delay register DR$_3$ and the other input terminal of adder 39.

Transversal filters TF$_1$', TF$_2$', and TF$_3$' shown in FIG. 2 are (transposition-type) FIR filters with orders of 2, 2, and 3, respectively. They are equivalent filters corresponding to transversal filters TF$_1$, TF$_2$, and TF$_3$, respectively. That is, in first transversal filter TF$_1$', since the coefficient of the multiplier is 1, the value of the signal input to adder 11 is identical to that when multiplier 17 is not inserted (first transversal filter TF$_1$ in FIG. 1). In second transversal filter TF$_2$', since the coefficient is 1 for multiplier 26, the value of the signal input to adder 20 is identical to that when multiplier 26 is not inserted (second transversal filter TF$_1$ in FIG. 1). In third transversal filter TF$_3$', since the coefficient is 0 for multipliers 36, 37, adders 38, 39 act as buffers, and the values of the signals input to adder AD and delay registers 33, 34 are identical to those when multipliers 31, 32 and adders 38, 39 are not inserted (third transversal filter TF$_3$ in FIG. 1). Consequently, the digital filter shown in FIG. 1 is virtually equivalent to the digital filter shown in FIG. 2.

Let us look at FIG. 1 again. In this IIR filter, the filtering processing is carried out using the following three signal processing units with their functions divided by means of first and second delay registers DR$_1$ and DR$_2$, that is, signal processing unit TF$_1$ having transfer function B(z), signal processing unit TF$_2$ having transfer function A(–z), and signal processing unit SF(AD, DR$_3$, TF$_3$) having transfer function of 1/A(–z)·A(z). Due to this division, in this IIR filter, the time needed for performing one cycle of operation depends on the longest operation time among the operation times of the aforementioned signal processing units TF$_1$, TF$_2$, and SF(AD, DR$_3$, TF$_3$). In each signal processing unit, the time needed for the operation depends on the operation time of each multiplier-adder chain including one multiplier and one adder. Consequently, the time needed for one cycle of operation of the digital filter is nearly equal to the time needed by one multiplier and one adder.

In this case, signal processing unit TF$_1$ is equivalent to transposition-type FIR filter TF$_1$' shown in FIG. 2; signal processing unit TF$_2$ is equivalent to transposition-type FIR filter TF$_2$' shown in FIG. 2; and signal processing unit SF (AD, DR$_3$, TF$_3$) is equivalent to the circuit comprising a combination of adder AD, third delay register DR$_3$, and third transposition-type FIR filter TF$_3$' as shown in FIG. 2. Since the times needed for one cycle of operation for FIR filters TR$_1$', TR$_2$', and TR$_3$' depend on the operation time of the multiplier-adder chain including one multiplier and one adder, the time needed for one operation cycle in each FIR filter is the sum of the operation times needed for one multiplier and one adder. In the digital filter shown in FIG. 2, since the multiplier-adder chain includes multiplier 36, adder 38, and adder AD, the time needed for one operation cycle becomes the sum of the operation times of one multiplier and two adders.

However, since the coefficient is 0 for multiplier 36, multiplier 36 and adder 38 do not actually perform an operation, Consequently, even in the digital filter shown in FIG. 2, the time needed for one operation cycle is equal to the operation time of the multiplier-adder chain including one multiplier and one adder in each of the FIR filters $TF_1'$, $TF_2'$, and $TF_3'$, that is the sum of the operation times needed for one multiplier and one adder.

The digital filter of this invention is a digital filter which is mathematically equivalent to the conventionally used direct-type IIR filter and which has the smallest possible time for operation of the filtering processing as explained in the above. In the following, this will be explained in detail.

FIG. 15 shows the aforementioned direct-type second order IIR filter. The transfer function of this IIR filter is as follows:

$$H(z)=B(z)/A(z) \quad (1)$$

First of all, this transfer function H(z) is multiplied by $Z^{-3}$:

$$H'(z)=\{B(z)\times Z^{-3}\}/A(z) \quad (2)$$

Since the $Z^{-3}$ term, which shows the delay in formula (2), has no influence on transfer function H(z), H(z) is virtually equivalent to H'(z).

Then, transfer function H'(z) A(-z)/A(-z) is multiplied by A(-z)/A(-z):

$$\begin{aligned} H''(z) &= H'(z) \times \{A(-z)/A(-z)\} \\ &= \{B(z) \times A(-z) \times Z^{-3}\}/\{A(z) \times A(-z)\} \end{aligned} \quad (3)$$

In formula (3), since $\{A(-z)/A(-z)\}=1$, H'(z)=H''(z), and H(z)=H''(z).

Then, this transfer function H''(z) is divided by the formulas of three cascade filters:

$$H''(z)=\{B(z)\times Z^{-1}\}\times\{A(-z)\times Z^{-1}\}\times\{Z^{-1}/[A(-z)\times A(z)]\} \quad (4)$$

Figure 3:
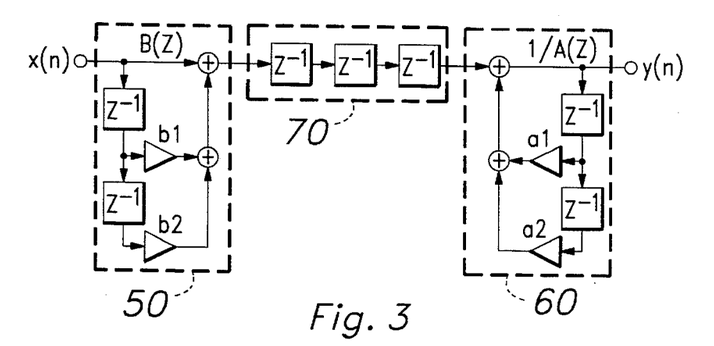
FIG. 3 is a diagram illustrating the architecture of the digital filter represented by formula (2).

In FIG. 3, formula (2) represents the architecture of the digital filter. As far as the configuration of this digital filter is concerned, the second order direct-type IIR filter shown in FIG. 15 is divided into recursible portion 50, and nonrecursible portion 51, with three pipeline registers 52 inserted between them. Recursible portion 50 represents transfer function B(z); nonrecursible portion 51 represents transfer function 1/A(z); and pipeline register 52 represents transfer function $Z^{-3}$.

Figure 4:
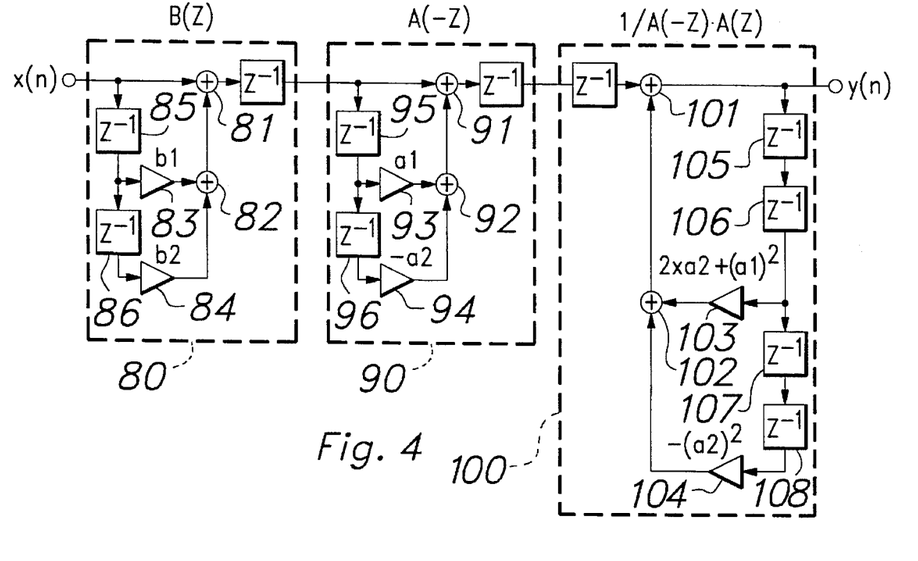
FIG. 4 is a diagram illustrating the architecture of the digital filter represented by formula (4).

FIG. 4 represents a hardware architecture of formula (4) obtained by performing a scattered look-ahead translation for formula (2). First block 80 represents transfer function B(z), and second block 100 represents transfer function 1/[A(-z)*A(z)]. Since $Z^{-1}$ represents the delay, whether the transfer function is multiplied by $Z^{-1}$ or not, the characteristics of the transfer function remain equivalent.

Figure 5:
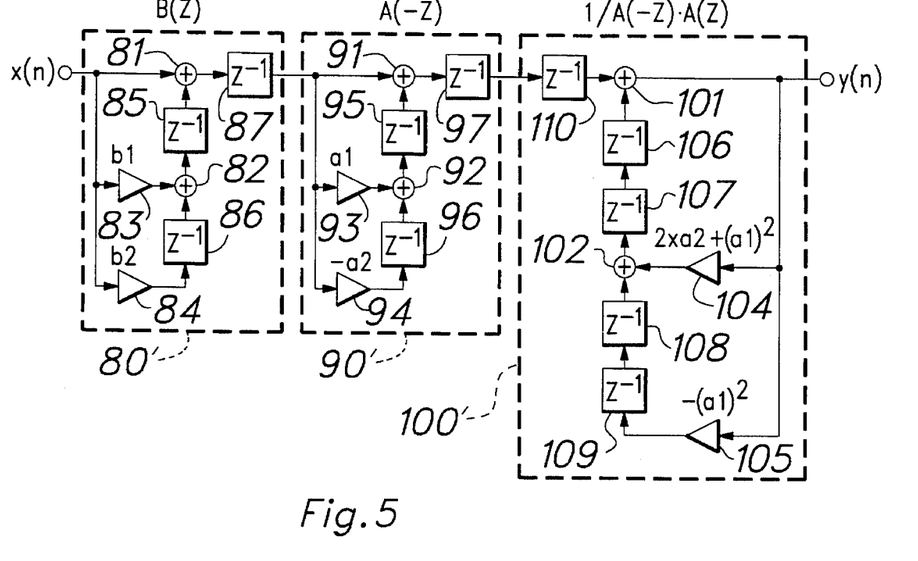
FIG. 5 is a diagram illustrating the architecture of the three block portions connected in cascade in FIG. 4 represented in the transposition form.

FIG. 5 shows the architecture represented by the transposition forms 80', 90', and 100' of the three block portions 80, 90, and 100 connected in cascade as shown in FIG. 4. By means of this representation of transposition forms, in first block portion 80', delay register 85 is inserted between adder 82 and adder 81, and delay register 86 is inserted between multiplier 84 and adder 82. In second block portion 90', delay register 95 is inserted between adder 92 and adder 91, and delay register 96 is inserted between multiplier 94 and adder 92. Similarly, in third block portion 100', delay registers 106, 107 are inserted between adder 102 and adder 101, and delay registers 108, 109 are inserted between multiplier 105 and adder 102.

Figure 6:
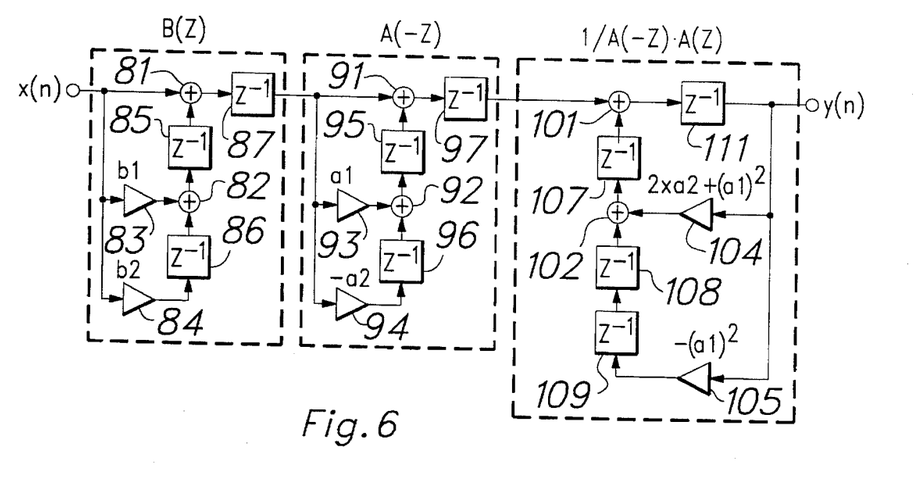
FIG. 6 is a diagram illustrating the architecture in which retiming treatment is performed for block 100' of the digital filter shown in FIG. 5.

FIG. 6 shows the architecture of retiming processing for block 100' shown in FIG. 5. By means of the retiming processing, delay registers 106, 110 of block 100' are deleted from block 100', and a new delay register 111 is inserted right after the output of adder 101. For the architecture shown in FIG. 6, the configuration is totally identical to that of the architecture of the digital filter in the first embodiment of this invention.

As shown in FIG. 6, the block of transfer function B(z), the block of transfer function A(-z), and the block of transfer function 1/A(-z)·A(z) are connected in series. The connection order for these three blocks may be selected anyway. For example, even when the block of transfer function 1/A(-z)·A(z), the block of transfer function B(z), and the block of transfer function A(-z) are connected in series, there is still no change in the filter characteristics. This can be seen clearly from formula (4).

Above, the circuit configuration of FIG. 1 is explained with reference to the circuit configurations shown in FIGS. 15, 3, 4, 5, and 6. As a result, it can be seen that the digital filter shown in FIG. 1 as the first embodiment of this invention is equivalent to the second order direct-type IIR filter shown in FIG. 15. In the digital filter shown in FIG. 1, the chain configuration of the operator that determines the operation time of one cycle is only the multiplier-adder chain including one multiplier and one adder; hence, the operation time needed does not exceed the sum of the times needed by one multiplier and one adder.

Figure 7:
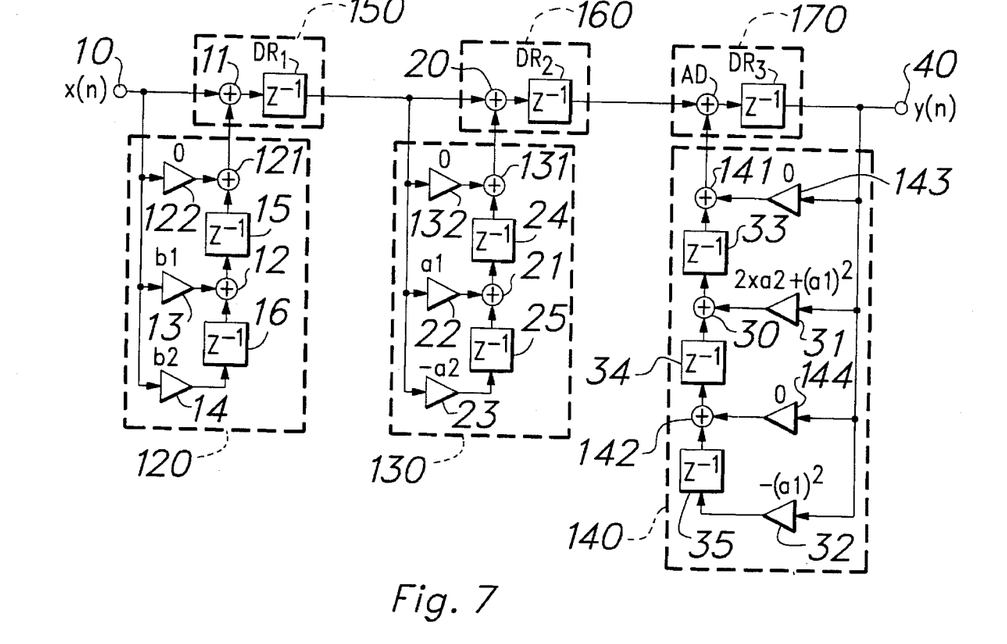
FIG. 7 is a diagram illustrating the architecture of a modified version of the digital filter shown in FIG. 1.

The IIR filter of FIG. 1 may also be modified to the architecture shown in FIG. 7. The IIR filter shown in FIG. 7 is formed by adding four adders 121, 131, 141, 142, and four multipliers 122, 132, 143, 144 to the IIR filter shown in FIG. 1. In first transversal filter 120, adder 121 is inserted between delay register 15 and adder 11, and multiplier 122 is connected between signal input terminal 10 and adder 121. In second transversal filter 130, adder 131 is inserted between delay register 24 and adder 20, and multiplier 132 is connected between delay register $DR_1$ and adder 131. In third transversal filter 140, adder 141 is inserted between delay register 33 and adder AD; multiplier 143 is connected between signal output terminal 40 and adder 141; multiplier 142 is inserted between delay register 35 and delay register 34; and multiplier 144 is connected between signal output terminal 40 and adder 142.

In this IIR filter, adder 11 and delay register $DR_1$, adder 20 and delay register $DR_2$, as well as adder AD and delay register $DR_3$ form adder-register blocks 150, 160, and 170, respectively. In addition, transversal filter 120 comprising three multipliers 122, 13, 14, two adders 121, 12, and two delay registers 15, 16 forms a second order transposition type FIR filter. Similarly, transversal filter 130 comprising three multipliers 132, 22, 23, two adders 131, 21, and two delay registers 24, 25 is a second order transposition type FIR filter. On the other hand, transversal filter 140 comprising four multipliers 143, 31, 144, 32, three adders 141, 30, 142, and three delay registers 33, 34, 35 is a third-order transposition FIR filter 140.

For the four multipliers 122, 132, 143, 144 added to the IIR filter shown in FIG. 1, the coefficients are 0. Consequently, adders 121, 131, 141, 142 play a buffer function. Consequently, the input signals to adders 11, 20, AD of FIG. 7 are identical to those before adding the four adders 121, 131, 141, 142, and four multipliers 122, 132, 143, 144. Consequently, the IIR filter of FIG. 1 is equivalent to the IIR filter of FIG. 7. In this way, in the first embodiment of this invention, the IIR filter comprises three adder-register blocks 150, 160, 170 and three FIR filters 120, 130, 140.

For the digital filter shown in FIG. 7, the filtering processing is carried out using two adder-register blocks 150, 160. More specifically, the function is divided into the following three signal processing portions by means of two delay registers $DR_1$ and $DR_2$, that is, first signal processing portion comprising adder-register block 150 and FIR filter 120, second signal processing portion comprising adder-register block 160 and FIR filter 130, and third signal processing portion comprising adder-register block 170 and FIR filter 140.

In the digital filter shown in FIG. 7, the chain configuration of the longest operator which determines the time needed for one cycle of operation comprises the multiplier-adder chain including multiplier 122 and adders 121, 11, the multiplier-adder chain including multiplier 132 and adders 131, 20, and the multiplier-adder chain including multiplier 143 and adders 141, AD. For each of these three multiplier-adder chains, the time needed for one cycle of operation is the sum of the operation times needed for one multiplier and two adders. However, since the coefficients of multipliers 122, 132, 143 are 0, multipliers 122, 132, 143, and adders 121, 131, 141 actually do not perform any operation. Consequently, in the digital filter shown in FIG. 7 comprising adder-register blocks 150, 160, 170, second order FIR filters 120, 130, and third-order FIR filter 140, the time needed for one cycle of operation is the sum of the operation times of one multiplier and one adder, that is, the operation time of the multiplier-adder chain including one multiplier and one adder within FIR filters 120, 130, and 140.

Figure 8:
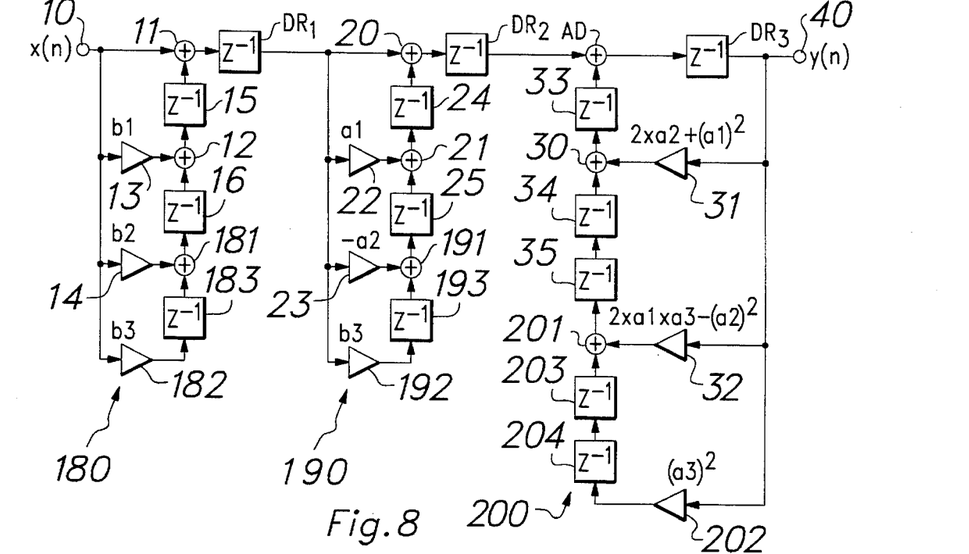
FIG. 8 is a diagram illustrating the architecture of a second embodiment of the digital filter of this invention.

FIG. 8 shows the architecture of a second embodiment of the digital filter in this invention. In this embodiment, the IIR filter is formed by adding three adders 181, 191, 201, three multipliers 182, 192, 202, and four delay registers 183, 193, 203, 204 to the IIR filter in FIG. 1. In first transversal filter 180, adder 181 is inserted between multiplier 14 and delay register 16; multiplier 182 is connected to signal input terminal 10; and delay register 183 is connected between multiplier 182 and adder 181. In second transversal filter 190, adder 191 is inserted between multiplier 23 and delay register 25; multiplier 192 is connected to the output terminal of first delay register $DR_1$; and delay register 193 is connected between multiplier 192 and adder 191. In third delay register filter 200, adder 201 is inserted between multiplier 32 and delay register 35; multiplier 202 is connected to signal output terminal 40; and delay registers 204, 203 are connected in series between multiplier 202 and adder 201. The digital filter shown in FIG. 8 is mathematically equivalent to the direct-type third-order IIR filter shown in FIG. 16.

Figure 9:
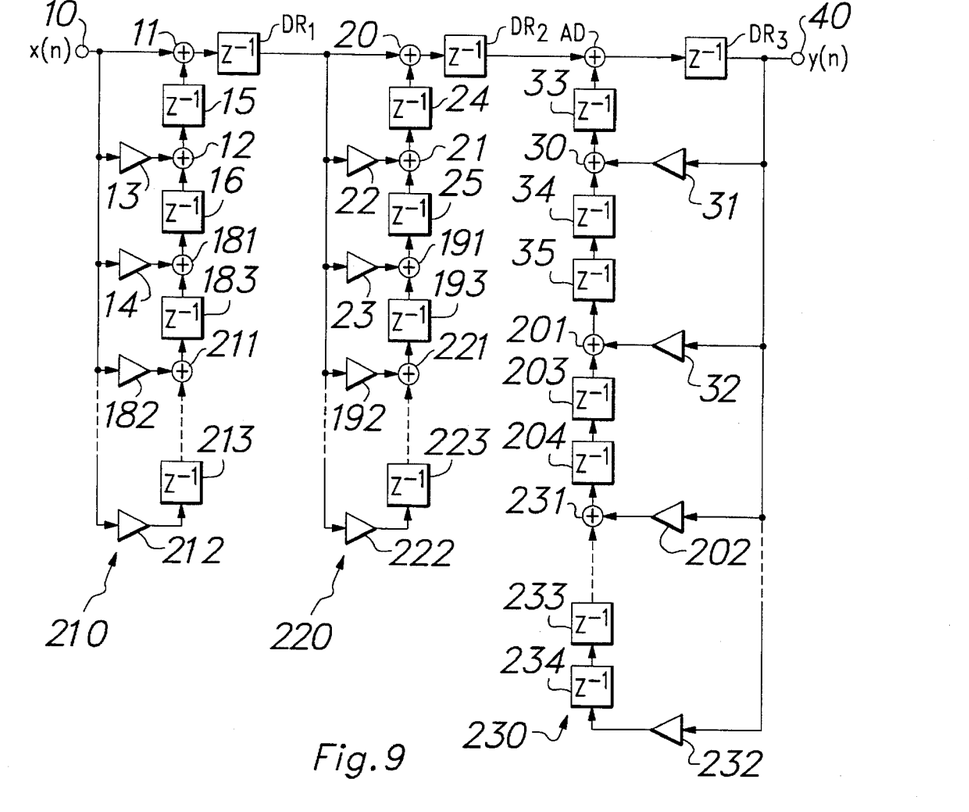
FIG. 9 is a diagram illustrating the architecture of another embodiment of the digital filter of this invention.

FIG. 9 shows the architecture in a third embodiment of the digital filter. This digital filter is equivalent to the direct-type Nth-order IIR filter shown in FIG. 17.

As can be seen from the second and third embodiments, for the direct-type IIR filter, each time the order is increased by one, as shown in FIG. 1, one multiplier, one adder, and one delay register are added in ladder form to signal processing unit $TF_1$, and one multiplier, one adder, and one delay register are added in ladder form to signal processing unit $TF_2$, and one multiplier, one adder, and two delay registers are added in ladder form to signal processing unit $TF_3$.

Figure 10:
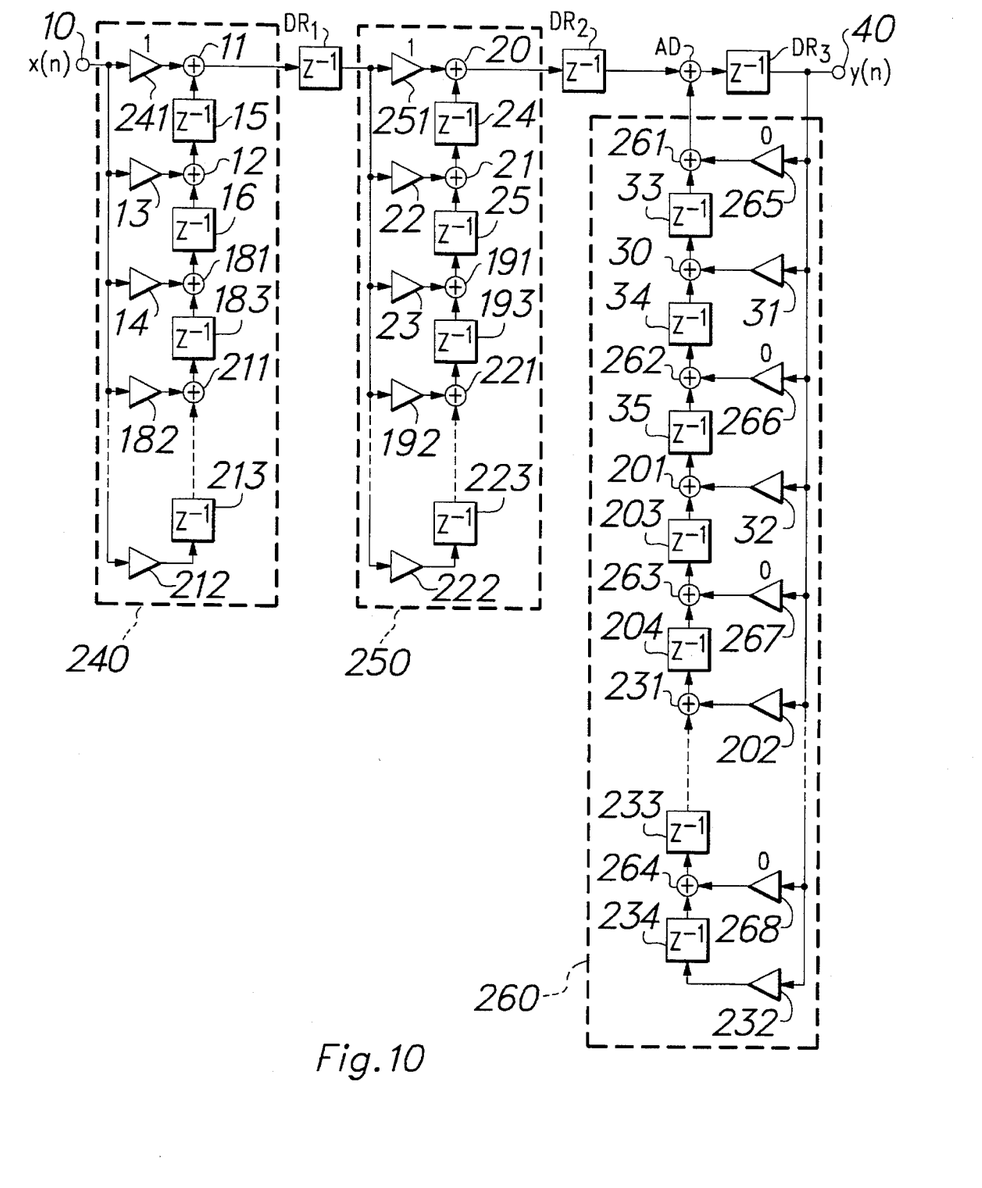
FIG. 10 is a diagram illustrating the architecture of a modified version of the digital filter shown in FIG. 9.
Figure 11:
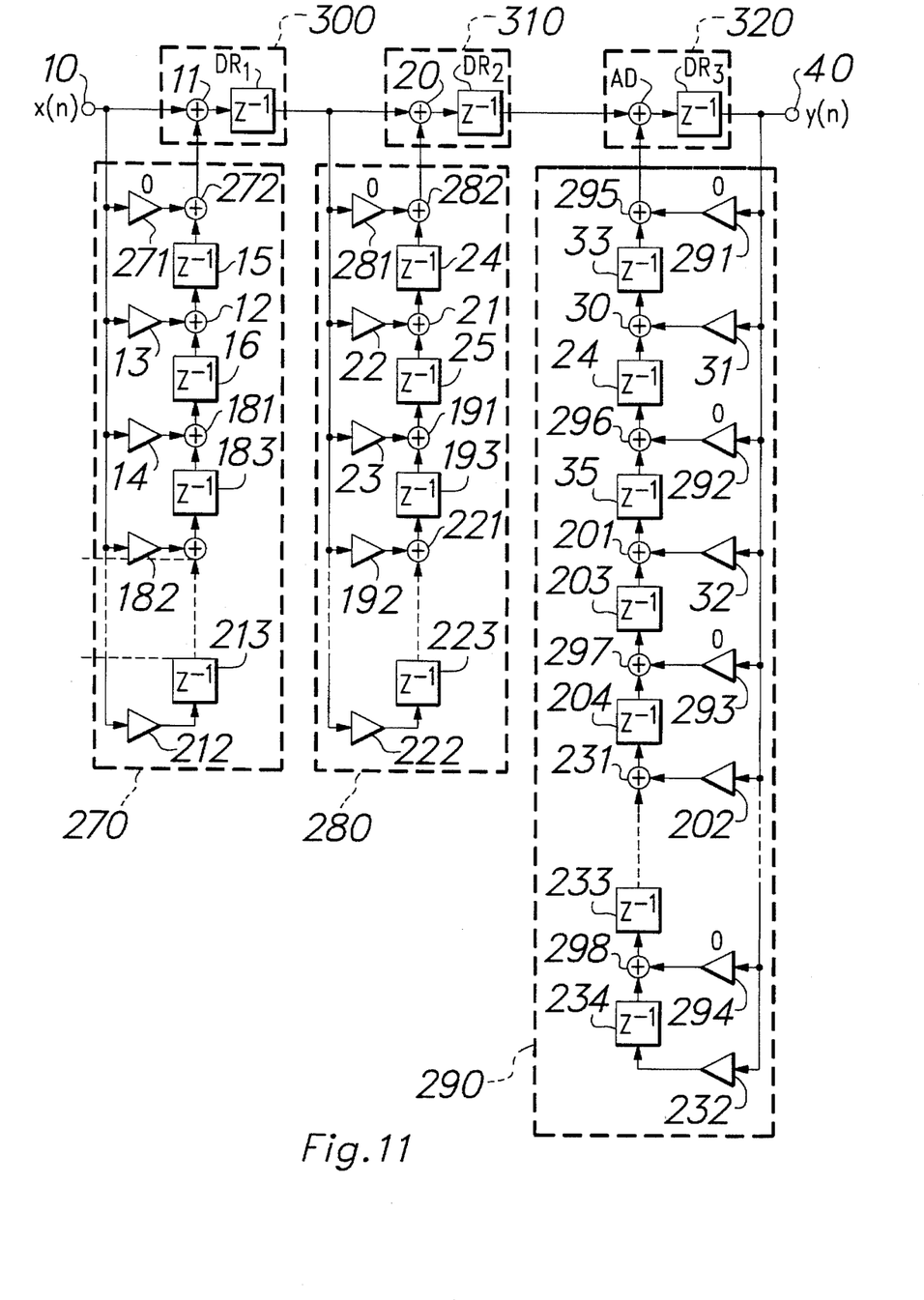
FIG. 11 is a diagram illustrating the architecture of a modified version of the digital filter shown in FIG. 9.

Just as in the first embodiment, the digital filter in the third embodiment may also be modified to the architectures shown in FIG. 10 and FIG. 11.

The digital filter shown in FIG. 10 is prepared by adding six multipliers 241, 251, 265, 266, 267, 268 and four adders 261, 262, 263, 264 to the digital filter shown in FIG. 9. Just as in the modified version of the first embodiment shown in FIG. 2, it comprises three transversal filters 240, 250, 260, three delay registers $DR_1$, $DR_2$, $DR_3$, and one adder AD. Transversal filters 240, 250, 260 are transposition type FIR filters, and their orders are N, N, and 2N-1 (where N is an integer with $N \geq 2$). The digital filter is divided by delay registers $DR_1$, $DR_2$ into three signal processing units. The Nth order FIR filter 240 is the first signal processing unit with a transfer function of B(z); Nth order FIR filter 250 is the second signal processing unit with a transfer function of A(−z); and the circuit comprising adder AD, delay register $DR_3$, and (2N-1)th order FIR filter 260 serves as the third signal processing unit with a transfer function of 1/A(−z)·A(z). In this case, there is no change in the filter characteristics when the order of the first signal processing unit, the second signal processing unit, and the third signal processing unit is changed.

Consequently, in the digital filter shown in FIG. 10, the chain configuration of the operator that determines the time needed for one cycle of operation is the multiplier-adder chain including one multiplier and one adder in each FIR filter 240, 250, and 260. In each multiplier-adder chain, the time needed for one cycle of operation does not exceed the sum of the operation times needed by one multiplier and one adder, respectively. As in the chain configuration of the operators in the third signal processing unit, there is a multiplier-adder chain including multiplier 265, adder 261, and AD. However, since the coefficient of multiplier 265 is 0, the actual operation time of this multiplier-adder chain is only the operation time of adder AD.

The digital filter shown in FIG. 11 is prepared by adding six multipliers 271, 281, 291, 292, 293, 294 and six adders 272, 282, 295, 296, 297, 298 to the digital filter shown in FIG. 9. Just as in the modified version of the first embodiment shown in FIG. 7, it comprises three transversal filters 270, 280, 290, and three adder-register blocks 300, 310, 320. Transversal filters 270, 280, 290 are all transposition-type FIR filters, and their orders are N, N, and 2N-1, respectively (where N is an integer with $N \geq 2$). The digital filter is divided by adder-register blocks 300, 310, or, more precisely, by delay registers $DR_1$, $DR_2$ into three signal processing units. Adder-register block 300 and Nth order FIR filter 270 form the first signal processing unit with a transfer function of B(z); adder-register block 310 and Nth order FIR filter 280 form the second signal processing unit with a transfer function of A(−z); and adder-register block 320 and (N−1)th order FIR filter 290 form the third signal processing unit with a transfer function of 1/A(−z)·A(z). In this case, there is no change in the filter characteristics when the order of the first signal processing unit, the second signal processing unit, and the third signal processing unit is changed.

Consequently, in the digital filter shown in FIG. 11, the chain configuration of the operator that determines the time needed for one cycle of operation is the multiplier-adder chain including one multiplier and one adder in each FIR filter 270, 280, and 290. In each multiplier-adder chain, the time needed for one cycle of operation does not exceed the sum of the operation times needed by one multiplier and one adder, respectively. As in the chain configuration of the operators in the third signal processing unit, there is a multiplier-adder chain including multiplier 271, and adders 272, 11. However, since the coefficient of multiplier 271 is 0, the actual operation time of this multiplier-adder chain is only the operation time of adder 11.

The same configuration applies to the multiplier-adder chain including multiplier 281 and adders 282, 20, and to the multiplier-adder chain including multiplier 291 and adders 295, AD.

As can be seen clearly from the aforementioned embodiment, the direct-type Nth order IIR filter (where N is an integer with N≧2) can be developed into a digital filter comprising two transposition-type Nth order FIR filters, one transposition-type (2N-1)th order FIR filter, three delay registers, and one adder, or comprising three adder-register blocks, two transposition-type Nth order FIR filters and one transposition type (2N-1)th order FIR filter. For the developed digital filter, the filtering processing is performed by a configuration divided into three signal processing units by two delay registers. Since the operation time needed for these three signal processing units is the sum of the operation times needed for one multiplier and one adder in the multiplier-adder chain including one multiplier and one adder, the operation can be carried out at a high speed. In this type of digital filter, even when the order of the filter is increased, the operation time remains that of the multiplier-adder chain including one multiplier and one adder. Consequently, the time needed for the operation remains unchanged.

Figure 12:
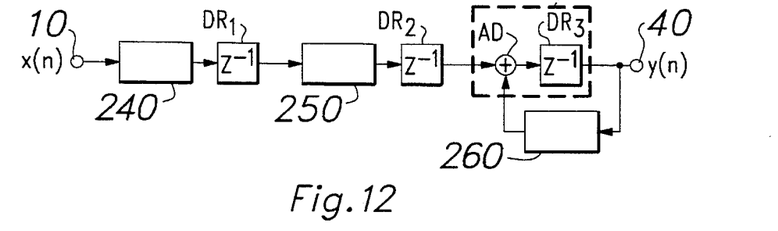
FIG. 12 is a diagram illustrating the block form of the digital filter in FIG. 10.
Figure 13:
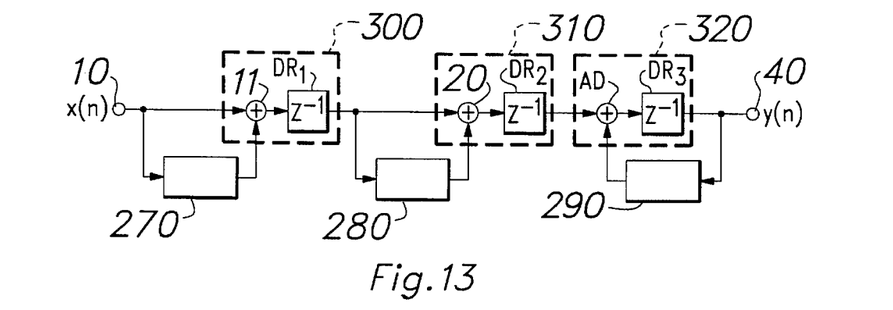
FIG. 13 is a diagram illustrating the block form of the digital filter in FIG. 11.

FIG. 12 or 13 shows the configuration of the block diagram of the Nth order IIR filter in the third embodiment shown in FIG. 9 as a general example of the digital filter of this invention. FIG. 12 is a block diagram of the digital filter shown in FIG. 10. FIG. 13 is a block diagram of the digital filter shown in FIG. 11. In FIG. 12, adder AD and delay register $DR_3$ form adder register block 269. Of course, the first and second embodiments of this invention shown in FIGS. 1 and 8 can have the configurations represented by the block diagrams shown in FIGS. 12 and 13, respectively.

In FIGS. 12 and 13, since delay registers $DR_1$ and $DR_2$ do not affect the characteristics of the digital filter at all, it is possible to delete these two delay registers in cases when the operation time is not a serious problem.

Figure 14:
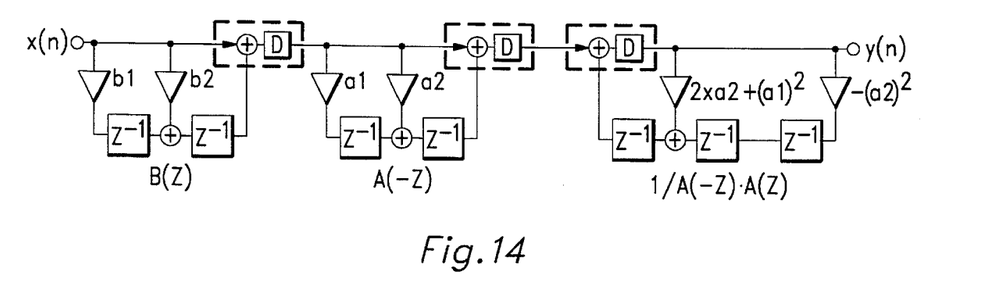
FIG. 14 is a diagram illustrating the floor plan of the digital filter in FIG. 1.

FIG. 14 shows the layout of the hardware when the architectural diagram of the first embodiment of this invention shown in FIG. 1, that is, a semiconductor IC, is to be manufactured. As can be seen in FIG. 14, the elements in FIG. 1 are set up in a straight line configuration to realize the digital filter, and the floor plan is very simple. In this embodiment, the "terminals" refer to the internal terminals, that is, a portion of the mutual wiring. In the second and third embodiments of this invention shown in FIGS. 8 and 9, the same simple floor plan of the hardware as in the first embodiment can also be realized.

As explained above, in this invention, a systematic development can be realized for the direct-type IIR filter into three transposition-type FIR filters transversal filters), three delay registers and one adder shown in FIG. 12, or into three adder-register blocks and three transposition-type FIR filters (transversal filters) as shown in FIG. 13. In the digital filter with the aforementioned configuration, the time needed for one cycle of operation is the sum of the operation times of one multiplier and one adder and is independent of the order of the filter. Consequently, even when the order of the filter is increased, the digital filter formed still has a short operation time. As a result, it is possible to realize a digital filter with a high speed without sacrificing the frequency characteristics. In addition, it is also possible to realize the automatic synthesis of the VLS-layout by means of a silicon compiler.

We claim:

1. An infinite impulse response digital filter for filtering an input signal comprising:

an input terminal for receiving the input signal to be filtered;

a first transversal filter having an input connected to said input terminal for receiving the input signal to be filtered and producing a first filtered output;

first delay means connected to an output of said first transversal filter;

a second transversal filter having an input connected to an output of said first delay means and producing a second filtered output;

second delay means connected to an output of said second transversal filter;

adder means having an input connected to an output of said second delay means;

third delay means having an input connected to an output of said adder means;

an output terminal from which the filtered output of the infinite impulse response digital filter is provided;

said adder means and said third delay means being connected between said second delay means and said output terminal;

said output terminal being connected to an output of said third delay means; and a third transversal filter having an input connected to the output of said third delay means and an output connected to a second input of said adder means.

2. An infinite impulse response digital filter for filtering an input signal comprising:

an input terminal for receiving the input signal to be filtered;

a first transversal filter having an input connected to said input terminal for receiving the input signal to be filtered and producing a first filtered output;

first delay means connected to an output of said first transversal filter;

a second transversal filter having an input connected to an output of said first delay means and producing a second filtered output;

second delay means connected to an output of said second transversal filter;

adder means having an input connected to an output of said second delay means;

third delay means having an input connected to an output of said adder means;

an output terminal from which the filtered output of the infinite impulse response digital filter is provided;

said adder means and said third delay means being connected between said second delay means and said output terminal;

said output terminal being connected to an output of said third delay means; and a third transversal filter having an input connected to the output of said third delay means and an output connected to a second input of said adder means, said third transversal filter including a plurality of multipliers connected in parallel with respect to each other and to the output of said third delay means, at least one adder corresponding to one of said multipliers and having a first input connected to an output of said one multiplier, and respective additional delay means disposed at a second input and an output of said adder of said third transversal filter, a first of said additional delay means being connected to said second input of said adder of said third transversal filter and a second of said additional delay means being connected to the output of said adder of said third transversal filter and having an output connected to said second input of said adder means.

3. A digital filter as set forth in claim 2, wherein said third transversal filter further includes a plurality of adders corresponding to all but one of said plurality of multipliers and having a respective input connected to the output of the multiplier corresponding thereto;

said additional delay means of said third transversal filter comprising respective delay means interposed between successive adders of said third transversal filter and defining therewith a chain of alternating delay means and adders;

said additional delay means respectively providing an input to a successive adder and receiving an input from a preceding adder; and the adder of said third transversal filter located at one end of the chain of alternating delay means and adders being connected to said second input of said adder means.

4. A digital filter as set forth in claim 3, wherein each of said first and second transversal filters includes a chain of alternating adders and delay registers;

a plurality of multipliers connected in parallel with respect to each other, and including a first multiplier connected to the input of a delay register at one end of the chain and at least one additional multiplier connected to a second input of the adder succeeding a preceding delay register; and said plurality of multipliers each having an input connected to said input terminal.

5. A digital filter as set forth in claim 4, further including additional delay registers and adders in the chain of alternating delay registers and adders; and additional multipliers included in the plurality of multipliers connected in parallel and having an input connected to said input terminal for receiving the input signal and an output connected to a second input of an adder corresponding thereto included in the chain of alternating delay registers and adders.

6. A digital filter as set forth in claim 4, wherein each of said first and second transversal filters further includes an additional multiplier connected in parallel with said plurality of multipliers and having an input connected to said input terminal for receiving the input signal and an output connected to the first input of said adder included at the top of the chain of alternating adders and delay registers.

7. A digital filter as set forth in claim 2, wherein each of said first and second transversal filters includes a chain of alternating adders and delay registers;

a plurality of multipliers connected in parallel with respect to each other, and including a first multiplier connected to the input of a delay register at one end of the chain and at least one additional multiplier connected to a second input of the adder succeeding a preceding delay register; and said plurality of multipliers each having an input connected to said input terminal.

8. A digital filter as set forth in claim 7, further including additional delay registers and adders in the chain of alternating delay registers and adders; and additional multipliers included in the plurality of multipliers connected in parallel and having an input connected to said input terminal for receiving the input signal and an output connected to a second input of an adder corresponding thereto included in the chain of alternating delay registers and adders.

9. A digital filter as set forth in claim 7, wherein each of said first and second transversal filters further includes an additional multiplier connected in parallel with said plurality of multipliers and having an input connected to said input terminal for receiving the input signal and an output connected to the first input of said adder included at the top of the chain of alternating adders and delay registers.

10. An infinite impulse response digital filter for filtering an input signal comprising;

an input terminal for receiving the input signal to be filtered;

a first transversal filter having an input connected to said input terminal for receiving the input signal to be filtered and producing a first filtered output;

first delay means connected to an output of said first transversal filter;

a second transversal filter having an input connected to an output of said first delay means and producing a second filtered output;

second delay means connected to an output of said second transversal filter;

adder means having an input connected to an output of said second delay means;

third delay means having an input connected to an output of said adder means;

an output terminal from which the filtered output of the infinite impulse response digital filter is provided;

said adder means and said third delay means being connected between said second delay means and said output terminal;

said output terminal being connected to an output of said third delay means;

a third transversal filter having an input connected to the output of said third delay means and an output connected to a second input of said adder means;

first and second sets of adder means and delay means connected to the output of said first transversal filter and said second transversal filter respectively, the delay means associated with said first transversal filter being said first delay means and the delay means associated with said second transversal filter being said second delay means;

said first and second sets of adder means and delay means being connected in series with said adder means and said third delay means operably connected to said third transversal filter; and said input terminal being connected to a first input of said adder means included in said first set of adder means and delay means operably associated with said first transversal filter.

11. A digital filter as set forth in claim 10, wherein each of said first and second transversal filters includes a chain of alternating adders and delay registers;

a plurality of multipliers connected in parallel with respect to each other, and including a first multiplier connected to the input of a delay register at one end of the chain and at least one additional multiplier connected to a second input of the adder succeeding a preceding delay register; and said plurality of multipliers each having an input connected to said input terminal.

12. A digital filter as set forth in claim 11, further including additional delay registers and adders in the chain of alternating delay registers and adders; and additional multipliers included in the plurality of multipliers connected in parallel and having an input connected to said input terminal for receiving the input signal and an output connected to a second input of an adder corresponding thereto included in the chain of alternating delay registers and adders.

13. A digital filter as set forth in claim 11, wherein each of said first and second transversal filters further includes an additional multiplier connected in parallel with said plurality of multipliers and having an input connected to said input terminal for receiving the input signal and an output connected to the first input of said adder included at the top of the chain of alternating adders and delay registers.

14. An infinite impulse response digital filter for filtering an input signal comprising:

an input terminal for receiving the input signal to be filtered;

a first transversal filter having an input connected to said input terminal for receiving the input signal to be filtered and producing a first filtered output;

first delay means connected to an output of said first transversal filter;

a second transversal filter having an input connected to an output of said first delay means and producing a second filtered output;

second delay means connected to an output of said second transversal filter;

each of said first and second transversal filters including a chain of alternating adders and delay registers, and a plurality of multipliers connected in parallel with respect to each other, and including a first multiplier connected to the input of a delay register at one end of the chain and at least one additional multiplier connected to a second input of the adder succeeding a preceding delay register, said plurality of multipliers each having an input connected to said input terminal;

adder means having an input connected to an output of said second delay means;

third delay means having an input connected to an output of said adder means;

an output terminal from which the filtered output of the infinite impulse response digital filter is provided;

said adder means and said third delay means being connected between said second delay means and said output terminal;

said output terminal being connected to an output of said third delay means; and a third transversal filter having an input connected to the output of said third delay means and an output connected to a second input of said adder means.

15. A digital filter as set forth in claim 14, further including additional delay registers and adders in the chain of alternating delay registers and adders; and additional multipliers included in the plurality of multipliers connected in parallel and having an input connected to said input terminal for receiving the input signal and an output connected to a second input of an adder corresponding thereto included in the chain of alternating delay registers and adders.

16. A digital filter as set forth in claim 14, wherein each of said first and second transversal filters further includes an additional multiplier connected in parallel with said plurality of multipliers and having an input connected to said input terminal for receiving the input signal and an output connected to the first input of said adder included at the top of the chain of alternating adders and delay registers.

17. An infinite impulse response digital filter for filtering an input signal comprising:

an input terminal for receiving the input signal to be filtered;

a first transversal filter having an input connected to said input terminal for receiving the input signal to be filtered and producing a first filtered output;

first delay means connected to an output of said first transversal filter;

a second transversal filter having an input connected to an output of said first delay means and producing a second filtered output;

second delay means connected to an output of said second transversal filter;

adder means having an input connected to an output of said second delay means;

third delay means having an input connected to an output of said adder means;

an output terminal from which the filtered output of the infinite impulse response digital filter is provided;

said adder means and said third delay means being connected between said second delay means and said output terminal;

said output terminal being connected to an output of said third delay means; and a third transversal filter having an input connected to the output of said third delay means and an output connected to a second input of said adder means, said third transversal filter including a chain of alternating delay means and adders in which first and second pairs of delay means are disposed on opposite sides of a first adder included in the chain, said first pair of delay means being connected to a first input of said adder and said second pair of delay means being connected to the output of said adder included in the chain of alternating delay means and adders of said third transversal filter, and a plurality of multipliers connected in parallel with respect to each other and having respective inputs connected to the output of said third delay means, the outputs of all but one of said plurality of multipliers being connected to corresponding adders included in the chain of alternating delay means and adders of said third transversal filter, the output of the remaining multiplier of said plurality of multipliers connected in parallel of said third transversal filter being connected to the input of said first pair of delay means.

* * * * *